US012765436B2

(12) United States Patent
Yuferev et al.

(10) Patent No.: US 12,765,436 B2
(45) Date of Patent: Oct. 13, 2026

(54) SEMICONDUCTOR PACKAGE AND METHOD FOR FABRICATING A SEMICONDUCTOR PACKAGE FOR UPRIGHT MOUNTING

(71) Applicant: Infineon Technologies Austria AG, Villach (AT)

(72) Inventors: Sergey Yuferev, Villach (AT); Josef Höglauer, Kirchheim-Heimstetten (DE); Gerhard Thomas Nöbauer, Villach (AT); Hao Zhuang, Hohenbrunn (DE)

(73) Assignee: Infineon Technologies Austria AG, Villach (AT)

( * ) Notice: Subject to any disclaimer, the term of this patent is extended or adjusted under 35 U.S.C. 154(b) by 498 days.

(21) Appl. No.: 18/351,170

(22) Filed: Jul. 12, 2023

(65) Prior Publication Data

US 2024/0030111 A1 Jan. 25, 2024

(30) Foreign Application Priority Data

Jul. 22, 2022 (EP) .................................... 22186561

(51) Int. Cl.
*H10W 70/40* (2026.01)
*H10W 90/00* (2026.01)
*H10W 90/10* (2026.01)

(52) U.S. Cl.
CPC ........ *H10W 90/811* (2026.01); *H10W 70/429* (2026.01); *H10W 70/442* (2026.01); *H10W 70/481* (2026.01); *H10W 90/10* (2026.01)

(58) Field of Classification Search
CPC ......... H01L 23/49575; H01L 23/49551; H01L 23/49555; H01L 23/49541; H01L 23/49562; H01L 23/49537; H10W 70/427; H10W 70/429; H10W 70/421; H10W 70/481; H10W 70/442; H10W 90/811
See application file for complete search history.

(56) References Cited

U.S. PATENT DOCUMENTS

| | | | |
|---|---|---|---|
| 2004/0212057 | A1 | 10/2004 | Otremba |
| 2007/0096317 | A1 | 5/2007 | Kiyohara |
| 2007/0138503 | A1 | 6/2007 | Germain et al. |

(Continued)

FOREIGN PATENT DOCUMENTS

| | | | |
|---|---|---|---|
| EP | 3971957 | A1 | 3/2022 |

*Primary Examiner* — Yu Chen
(74) *Attorney, Agent, or Firm* — Murphy, Bilak & Homiller, PLLC

(57) ABSTRACT

A semiconductor package includes low and high voltage contact pads, an output contact pad, a half-bridge circuit, and first, second and third leads. The half bridge circuit includes first and second transistor devices coupled in series at an output node. Both transistor devices have a first major surface which extends substantially perpendicularly to the low voltage contact pad, the high voltage contact pad, and the output contact pad. Both transistor devices are arranged in a device portion of the package and are mounted on a first lead, the first lead providing the output contact pad and being arranged on a first side of the device portion. The second and third leads are arranged in a common plane on a second side of the device portion that opposes the first side. The second lead provides the low voltage contact pad and the third second lead provides the high voltage contact pad.

12 Claims, 10 Drawing Sheets

(56) References Cited

U.S. PATENT DOCUMENTS

| | | | | |
|---|---|---|---|---|
| 2013/0003309 | A1* | 1/2013 | Stella ................ | H01L 23/49562 361/715 |
| 2014/0353766 | A1 | 12/2014 | Tan et al. | |

* cited by examiner

SEMICONDUCTOR PACKAGE AND METHOD FOR FABRICATING A SEMICONDUCTOR PACKAGE FOR UPRIGHT MOUNTING

BACKGROUND

A semiconductor package may include one or more semiconductor devices in a housing. The package may include a substrate or a leadframe which includes outer contacts which are used to mount the electronic component on a redistribution board such as a printed circuit board. The package also includes internal electrical connections from the semiconductor device to the substrate or leadframe. The housing may include a plastic molding compound which covers the semiconductor device and the internal electrical connections. Published US patent application US 2004/0212057 A1 discloses a semiconductor component including a housing and at least two semiconductor chips arranged in the housing.

Semiconductor packages which occupy a smaller area when mounted on a higher-level board, such as a circuit board, are desirable.

SUMMARY

According to the invention, a semiconductor package is provided that comprises a low voltage contact pad, a high voltage contact pad, an output contact pad and a half-bridge circuit. The half-bridge circuit comprises a first transistor device and a second transistor device coupled in series at an output node. The first transistor device has a first major surface and the second transistor device has a first major surface. The first major surface of the first transistor device and the first major surface of the second transistor device extend substantially perpendicularly to the low voltage contact pad, the high voltage contact pad and the output contact pad. The semiconductor package further comprises a first lead, a second lead and a third lead. The first and second transistor devices are arranged in a device portion of the semiconductor package and are mounted on the first lead, the first lead providing the output contact pad and being arranged on a first side of the device portion. The second and third leads are arranged in a common plane on a second side of the device portion that opposes the first side of the device position. The second lead provides the low voltage contact pad and the third lead provides the high voltage contact pad.

The low voltage contact pad, the high voltage contact pad and the output contact pad may be arranged substantially coplanar to one another and arranged in a first mounting surface of the semiconductor package and provide the outer contacts of the package. In some embodiments, the first mounting surface of the semiconductor package is the lower surface of the package. The first major surface of the first transistor device and the first major surface of the second transistor device each extends substantially perpendicularly to the first mounting surface of the package. The semiconductor package is suitable for upright or vertical mounting since the first major surface of each of the first and second transistor devices extends substantially perpendicularly to the low voltage contact pad, the high voltage contact pad and the output contact pad and the mounting surface.

The first mounting surface of the package with the low voltage contact pad, the high voltage contact pad and the output contact pad is mounted on a major surface of a circuit board so that in the mounted position, the first major surface of the first transistor device and the first major surface of the second transistor device each extends substantially perpendicularly to the major surface of the circuit board so that the package is mounted in a vertical or upright position with respect to the major surface of the circuit board. This vertical arrangement saves space on the circuit board, since the package with the half bridge occupies less space on the circuit board compared to an arrangement in which the first major surface of the first transistor device and the first major surface of the second transistor device extend substantially parallel to the major surface of the circuit board.

The semiconductor package has a stacked arrangement with the first transistor device arranged between the first lead and the second lead and the second transistor device arranged between the first lead and the third lead. The first and second transistor devices are arranged laterally adjacent to one another on the same surface of the first lead and the second and third leads are arranged laterally adjacent and spaced apart one another. The second and third leads may be substantially coplanar with one another.

In some embodiments, the first transistor device comprises a first power electrode on the first major surface and a second power electrode on a second major surface opposing the first major surface and the second transistor device comprises a first power electrode on the first major surface and a second power electrode on a second major surface opposing the first major surface. In some embodiments, the first lead comprises an inner surface, onto which the second power electrode of the first transistor device and the first power electrode of the second transistor device are attached. The second lead comprises an inner surface that is attached to the first power electrode of the first transistor device and the third lead comprises an inner surface that is attached to the second power electrode of the second transistor device.

The second power electrode of the first transistor device and the first power electrode of the second transistor device are electrically connected to the first lead, the first power electrode of the first transistor device is electrically connected to the second lead and the second power electrode of the second transistor device is electrically connected to the third lead.

As used herein, the term "electrode", as in power electrode, gate electrode, source electrode and drain electrode denotes the chip pad or chip terminal on the transistor device which is part of the metallization structure formed on the semiconductor substrate of the transistor device rather than an electrode formed in or at the first major surface of the transistor device which is part of the structure of the transistor device, for example part of the structure of a transistor cell.

In some embodiments, the second power electrode of the first transistor device is a drain electrode and the first power electrode of the second transistor device is a source electrode. Therefore, the first lead onto which they are attached forms the output node of the half-bridge circuit and provides the output pad of the package. The first power electrode of the first transistor device is a source electrode so that the second lead provides the low voltage contact pad and the second power electrode of the second transistor deice is a drain electrode so that the third lead provides the high voltage contact pad.

Each of the first, second and third leads has an outer surface that opposes the inner surface and side faces that extend between the inner and outer surfaces. The inner and outer surfaces are major surfaces, whereby the inner surfaces provide a mounting surface for a transistor device and are typically covered by a mold compound that also covers the transistor devices. The outer surfaces may remain exposed from the mold compound and provide a cooling surface.

In some embodiments, the first lead has a lower side face that extends substantially perpendicularly to the inner surface of the first lead and that provides the output contact pad, the second lead has a lower side face that provides the low voltage contact pad and that extends substantially perpendicularly to the inner surface and substantially parallel to the lower side face of the first lead, and the third lead has a lower side face that provides the high voltage contact pad and that extends substantially perpendicularly to the inner surface and substantially parallel to the lower side face of the first lead.

In some embodiments, the lower side face of the first, second and third leads are arranged in the mounting surface of the semiconductor package.

In some embodiments, the lower side face of each of the first, second and third leads has a length that is greater than the thickness of the lead in the mounting area. The first, second and third lead can be considered to have a L-shape with a foot. In some embodiments, the foot of each of the first, second and third leads has a lower surface that provides the respective contact pad. The foot of the first lead protrudes from the outer surface of the first lead and extends perpendicularly to and away from the outer and inner surface of the first lead and, therefore, also perpendicularly to the first major surface of the first and second transistor devices. The second lead also has a foot that protrudes from the outer surface of the second lead and extends perpendicularly to and away from the outer and inner surface of the second lead and the third lead also has a foot that protrudes from the outer surface of the third lead and extends perpendicularly to and away from the outer and inner surface of the third lead. The foot of the first lead extends in an opposing direction from the foot of each of the second and third leads. The foot of the second lead extends substantially parallel to the foot of the third lead.

In some embodiments, the first transistor device further comprises a first control electrode that is arranged on the first major surface and connected to a first control lead and the second transistor device further comprises a second control electrode that is arranged on the first major surface and connected to a second control lead. The first control electrode is arranged laterally adjacent the source electrode on the first major surface of the first transistor device and may provide a first gate electrode and the second control electrode is arranged laterally adjacent the source electrode on the first major surface of the second transistor device and may provide a second gate electrode. In these embodiments, the first and second gate electrodes of the metallization of the first and second transistor devices face in opposing directions within the semiconductor package.

In some embodiments, the first and second gate leads each have a lower side face that is arranged in the lower surface of the package and substantially coplanar with the low voltage contact pad, the high voltage contact pad and the output contact pad. The lower side faces of the first and second gate leads are arranged in a common plane with the second lead and the third lead on the second side of the device portion. In this embodiment, all of the outer connect pads of the semiconductor package are arranged in a common plane in a common mounting surface.

The first lead may have a cutout or removed section such that the inner and outer surfaces of the first lead have a L-shaped contour and the first lead has an L-shape in plan view. The second control electrode on the first major surface of the second transistor device is arranged in the cutout section so that the second control electrode is uncovered by the first lead and so that the second source electrode is mounted on the inner surface of the first lead. The third lead also has a cut-out section such that the inner and outer surfaces of the third lead have a L-shaped contour. The cutout section of the third lead is aligned with the cutout section in the first lead, for example both are positioned in an outer lower corner of the respective lead.

The second gate lead is arranged in the cutout section of the first lead and is arranged on and electrically connected to the second control electrode. The second gate lead extends from the first side of the device portion, underneath the lower facing side face of the second transistor device to the second side of the device portion. The second gate lead has a lower side face on the second side of the device portion that provides a second gate contact pad of the package. The second gate contact pad may be arranged in a row with the low voltage contact pad and the high voltage contact pad.

In an embodiment, the first control electrode is arranged in a cutout section of the second lead, for example a cutout section formed in an outer lower corner of the second lead at the opposing end of the package from the second gate lead. The inner and outer surfaces of the second lead have a L-shaped contour. The second control electrode is exposed from the second lead.

The first gate lead may have a L-shape with a foot that protrudes from an outer surface of the first gate lead extends away from the outer and an opposing inner surface of the first gate lead that is positioned on and electrically connected to the first gate electrode. The foot has a lower side face that provides the first gate contact pad of the package. The first gate contact pad may be arranged in a row with the low voltage contact pad and the high voltage contact pad and the second gate contact pad on the second side of the device portion. The output contact lead is arranged on the opposing first side of the device portion.

In some embodiments, the first transistor device comprises a first control electrode arranged on the first major surface and the second transistor device comprises a second control electrode arranged on the second major surface. The first control electrode is a gate electrode that is arranged laterally adjacent the source electrode on the first major surface of the first transistor device. The second control electrode is a second gate electrode. In contrast to the first transistor device, the second control electrode is arranged laterally adjacent the drain electrode on the second major surface of the second transistor device. In this embodiment, both the first and second control electrodes are arranged on the second side of the device portion and face in the same direction.

The first and second gate leads are arranged in a common plane with the second lead and the third lead. The first gate lead and the second gate lead may each have a L-shape with a foot protruding from the outer surface and substantially perpendicular to the inner and outer surface of the respective lead. In some embodiments, the lower surface of the foot provides the first gate contact pad and the second gate contact pad of the first and second gate lead, respectively, The transistor device comprises a plurality of transistor cells each having a transistor structure that are coupled in parallel to form the transistor device. For example, in the case of a MOSFET device each transistor cell comprises a source region, a body region and a gate formed at or in the first major surface, a drift region and a drain region formed at the opposing second major surface.

In embodiments in which the gate electrode of the metallization structure is located on the second major surface of the transistor device, the gates of the transistor structure, which are arranged on the opposing first major surface or in trenches in formed in the opposing first major surface, are electrically coupled to the gate electrode of the metallization structure by a conductive via that extends through the semiconductor substrate of the transistor device.

In some embodiments, the first gate electrode of the first transistor device and the first gate lead are arranged in a cut-out section of the second lead and the second gate electrode of the second transistor device and the second gate lead are arranged in a cut-out section of the third lead.

In some embodiments, the first gate lead has a lower side face that extends substantially parallel to the lower side face of the second lead and provides a first gate pad and the second gate lead has a lower side face that extends substantially parallel to the lower side face of the third lead and provides a second gate pad.

In some embodiments, the lower side face of the first and second gate leads is substantially parallel with the lower side face of the first, second and third leads and positioned in the lower mounting surface of the package. In some embodiments, the lower side face of each of the first and second gate leads has a length that is greater than the thickness of the portion that is attached to the first and second gate electrode, respectively. The first and second gate lead can be considered to have a L-shape with a foot having a lower surface that provides the respective contact pad. The foot of the first gate lead protrudes from the outer surface and extends substantially perpendicularly to the inner surface of the first gate lead and substantially perpendicularly to the first major surface of the first transistor device and the foot of the second gate lead protrudes from the outer surface and extends substantially perpendicularly to the inner surface of the second gate lead and substantially perpendicularly to the first major surface of the second transistor device. The foot of the first and second gate leads extends in the same direction and substantially parallel to one another and in the same direction and substantially parallel to the foot of each of the second and third leads.

In some embodiments, the first transistor device and/or second transistor device further comprises at least one auxiliary structure which is electrically connected to an auxiliary terminal formed in the metallization structure and the package comprises an auxiliary lead that is mounted on the auxiliary terminal. The auxiliary lead has a lower side face that extends substantially parallel to the lower side face of the second lead and that provides an auxiliary pad. The auxiliary structure may be a source sensing structure, for example.

An auxiliary terminal may be arranged laterally adjacent the first source electrode and the first gate electrode on the first major surface of the first transistor device. An auxiliary terminal may be arranged laterally adjacent the second source electrode and the second gate electrode on the first major surface of the second transistor device. In other embodiments, an auxiliary terminal may be arranged laterally adjacent the second drain electrode and the second gate electrode on the second major surface of the second transistor device.

The shape of the auxiliary lead may be the same as the shape of the control lead used for the same transistor device, e.g. an L-shape having an inner surface arranged on and electrically connected to the auxiliary terminal on that transistor device and a foot having a lower surface that extends substantially perpendicularly to the inner surface and that is substantially coplanar with the low voltage contact pad, the high voltage contact pad and the output contact pad and first and second gate pads.

In some embodiments, the first and second transistor devices are so called vertical transistor devices and may be a MOSFET (Metal Oxide Semiconductor Field Effect Transistor) device, an insulated gate bipolar transistor (IGBT) device or a Bipolar Junction Transistor (BJT).

The electrodes or terminals of the transistor device are referred to herein as source, drain and gate. As used herein, these terms also encompass the functionally equivalent terminals of other types of transistor devices, such as an insulated gate bipolar transistor (IGBT). For example, as used herein, the term “source” encompasses not only a source of a MOSFET device and of a superjunction device but also an emitter of an insulator gate bipolar transistor (IGBT) device and an emitter of a Bipolar Junction Transistor (BJT) device, the term “drain” encompasses not only a drain of a MOSFET device or of a superjunction device but also a collector of an insulator gate bipolar transistor (IGBT) device and a collector of a BJT device, and the term “gate” encompasses not only a gate of a MOSFET device or of a superjunction device but also a gate of an insulator gate bipolar transistor (IGBT) device and a base of a BJT device.

In some embodiments, the semiconductor package further comprises a mold compound covering at least part of the first and second transistor devices and at least part of the first, second and third leads. The lower surfaces of each of the first, second and third leads and of each of the first and second gate leads and auxiliary leads, if present, are exposed from the mold compound so as to be electrically accessible externally from the package and form the package outer contacts. The inner surface of the first, second and thirds may be covered by the mold compound. In some embodiments, at least part or all of the outer surface of the first, second and third leads remains exposed from the mold compound and forms a cooling surface for dissipating heat generated by the transistor devices. An additional heat dissipator or heat sink may be attached to one or more of the exposed outer surfaces.

In embodiments, in which the leads each have a foot, an upper surface of the foot that opposes the lower surface may form a contact pad for a capacitor. For example, a capacitor may be electrically coupled between the upper surface of the foot of the second lead and the upper surface of the foot of the third lead. This can also assist in reducing the area occupied by the package and capacitor when the combination is mounted on a circuit board.

In some embodiments, the lower side faces of the first, second and third leads and also of the first and second gate leads are arranged within an area of the semiconductor package defined by the mold compound. Each of the first, second and third leads and also of the first and second gate leads can be considered to have a planar shape and may have a thickness that is substantially the same throughout. In these embodiments, the leads do not have a protruding foot.

In some embodiments, in which the first lead has an L-shape and has a foot extending in a first direction and perpendicularly to the first major surface of the first transistor device, the second lead has a L-shape having a foot that extends in a second direction opposing the first direction and the third lead has a L-shape having a foot that extends parallel to the second direction, the foot of each of the first, second and third leads extends laterally outside of the area of the semiconductor package defined by the mold compound.

Embodiments of the package in which the leads include a foot may also be used for embedding the package in an upright position in a recess formed in a circuit board and, therefore, within the volume of the circuit board. In these embodiments, the surface of the semiconductor package including the low voltage contact pad, the high voltage contact pad, the output contact pad, first and second gate contact pads and auxiliary contact pads, if present, faces upwardly away from the circuit board. In this embodiment, the surface of the foot of each of the leads that opposes the lower surface that that extends into the outer surface of the upright portion of the lead provides the respective contact pad of that lead and are arranged in the mounting surface of the semiconductor package. The upper surface of the foot of each of the leads overlaps the major surface of the circuit board at a position laterally adjacent the recess in the major surface of the circuit board. The upper surface of the foot of the leads is arranged on and electrically connected to a conductive trace on the major surface of the circuit board so as to electrically connect the first, second and third lead as well as the first and second gate leads and first and second auxiliary leads, if present, to the circuit board.

In some embodiments, the semiconductor package includes two mounting surfaces on opposing side faces of the package, for example the lower and upper surface of the package. In some embodiments, the first and second gate contact pads and first and second auxiliary contact pads, if present, are arranged in a first mounting surface and the low voltage contact pad, high voltage contact pad and output contact pad are arranged in a second mounting surface that opposes the first mounting surface. In this embodiment, may be useful for applications in which the package is to be embedded within a circuit board. The power connections to the low voltage contact pad, high voltage contact pad and output contact pad can be positioned in a different layer of the circuit board from the control connections to the first and second gate contact pads and first and second auxiliary contact pads.

According to the invention, a method for fabricating a semiconductor package for upright mounting is provided. The method may be used to fabricate the semiconductor package according to any one of the embodiments described herein. The method comprises attaching a second power electrode on a second major surface of a first transistor device and attaching a first power electrode on a first major surface of a second transistor device to an inner surface of a first lead, attaching an inner surface of a second lead to a first power electrode on a first major surface of the first transistor device, the first major surface opposing the second major surface of the first transistor device and attaching an inner surface of a third lead to a second power electrode on a second major surface of the second transistor device, the second major surface opposing the first major surface of the second transistor device. The first lead, the second lead and the third lead each have a lower side face that extends substantially perpendicularly to its respective inner surface. The lower side face of each of the first, second and third leads are substantially coplanar and provide an output contact pad, a low voltage contact pad and a high voltage contact pad respectively of the semiconductor package.

The lower side face of each of the first, second and third leads extends substantially perpendicularly to the inner surface of the respective lead.

The package may be mounted in an upright position on a circuit board by mounting the output contact pad, the low voltage contact pad and the high voltage contact pad formed by the lower side faces of the first, second and third leads onto conductive traces on a major surface of a circuit board such that the first major surface of the first transistor device and the first major surface of the second transistor device is substantially perpendicular to the first major surface of the circuit board. In these embodiments, the lower side faces of the first, second and third leads provide the mounting surfaces.

In some embodiments, the method further comprises electrically connecting an inner surface of a first gate lead to a first gate electrode arranged on the first major surface of the first transistor device and/or an inner surface of a second gate lead to a second gate electrode arranged on the first major surface of the second transistor device.

In some embodiments, the method further comprises electrically connecting an inner surface of a first gate lead to a first gate electrode arranged on the second major surface of the first transistor device and/or an inner surface of a second gate lead to a second gate electrode arranged on the first major surface of the second transistor device.

In some embodiments, the method further comprises electrically connecting a lower surface of the foot of the first gate lead and/or of the second gate lead to conductive traces on the first major surface of the circuit board.

In some embodiments, the package further comprises a first auxiliary terminal on the first transistor device and a second auxiliary terminal on the second transistor device.

In some embodiments, the method further comprises electrically connecting an inner surface of a first auxiliary lead to a first auxiliary terminal arranged on the first major surface of the first transistor device and/or an inner surface of a second auxiliary lead to a second auxiliary terminal arranged on the first major surface of the second transistor device.

In some embodiments, the method further comprises electrically connecting an inner surface of a first auxiliary lead to a first auxiliary terminal arranged on the second major surface of the first transistor device and/or an inner surface of a second auxiliary lead to a second auxiliary terminal arranged on the first major surface of the second transistor device.

In some embodiments, the method further comprises electrically connecting a lower surface of the foot of the first auxiliary lead and/or of the second auxiliary lead to conductive traces on the first major surface of the circuit board.

In an embodiment, a circuit board is provided that has a first major surface, a recess in the first major surface and a plurality of conductive traces on the first major surface. The recess is sized and shaped to receive the semiconductor package in an upright orientation such that the inner surface of the first, second and third leads and the first major surface of the first and second transistor device is substantially perpendicular to the first major surface of the circuit board. The foot of each of the first, second and third leads has an upper surface that opposes the lower side face of the respective first, second and third leads. In some embodiments, the upper surface of the foot of the first, second and third leads provides the mounting surface of the semiconductor package.

The semiconductor package is inserted into the recess such that the upper surface of the first lead, second and third leads is substantially perpendicular to the first major surface of the circuit board and the lower surface of the first, second and third leads faces upwardly away from the recess. The inner surface of the foot of the first, second and third lead is electrically connected to the conductive traces.

In some embodiments, the method further comprises electrically connecting an upper surface of the foot of the first gate lead and/or of the second gate lead to conductive traces on the first major surface of the circuit board.

In some embodiments, the method further comprises electrically connecting an upper surface of the foot of the first auxiliary lead and/or of the second auxiliary lead to conductive traces on the first major surface of the circuit board.

In some embodiments, the method further comprises electrically connecting an upper surface of the foot of the first gate lead and/or of the second gate lead to conductive traces on a further surface other than the first major surface of the circuit board, for example an inner layer of a multilayer circuit board.

In some embodiments, the method further comprises electrically connecting an upper surface of the foot of the first auxiliary lead and/or of the second auxiliary lead to conductive traces on a further surface other than the first major surface of the circuit board, for example an inner layer of a multilayer circuit board.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

Figures 1A, 1B, 1C, 1D:
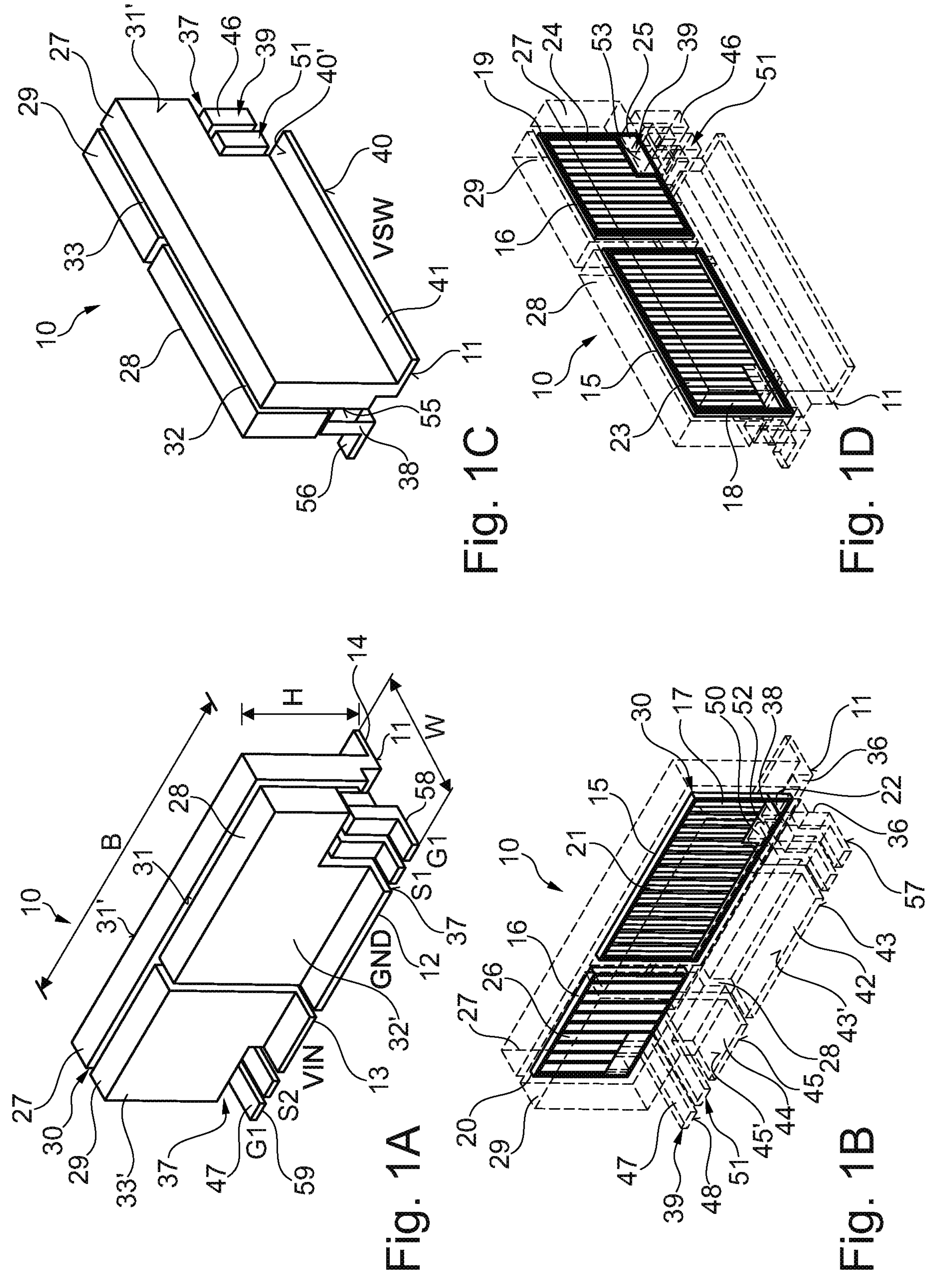
FIGS. 1A to 1G illustrate various views of a semiconductor package according to an embodiment which is suitable for upright or vertical mounting.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The application relates to a semiconductor package, which may also be referred to as a module, that comprises a power converter with a half bridge in the form of a vertical arrangement of the chips providing the high side switch and the low side switch with respect to the VIN, GND and VSW contacts of the package. The package has a reduced footprint area as compared with traditional devices where chip is located horizontally inside the package. Despite having a smaller footprint, larger area ("taller") chips can be included for further reduction of the chip and, consequently, device resistance without increasing the area that the package occupies on or in a board.

The footprint area of the package with the transistor devices arranged vertically inside the package is largely defined by the chip thickness and width, in contrast to length and width in devices with a lateral position of the chip inside the package. By arranging the chips vertically, the package footprint area can be reduced. Furthermore, chips of various dimensions, in particular with various areas of their opposing major surface, can be accommodated without a proportional increase of the footprint area of the package. Additionally, the thermal properties of the package may be improved by double-sided cooling from vertically arranged surfaces and package parasitics and package resistance are significantly reduced. This increases device density in user systems and improves their electrical and thermal performance.

The vertical half bridge power module may be mounted in two configurations so that the module may be a sit-on-top module located on the PCB or an embedded module inserted inside the PCB. An embedded module can be connected through various PCB layers.

Figure 1E:
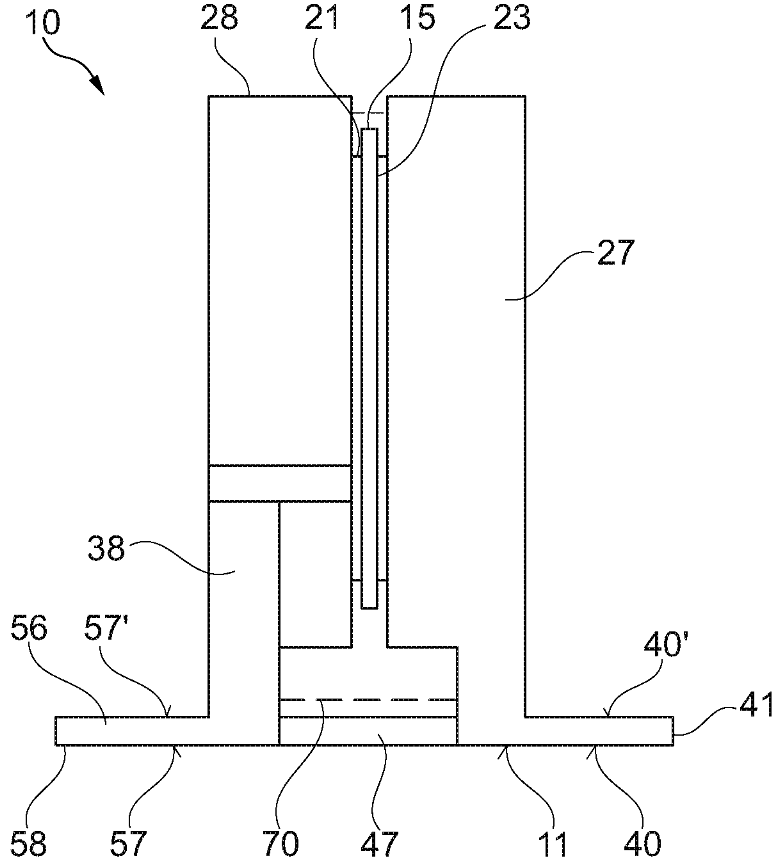
Figure 1F:
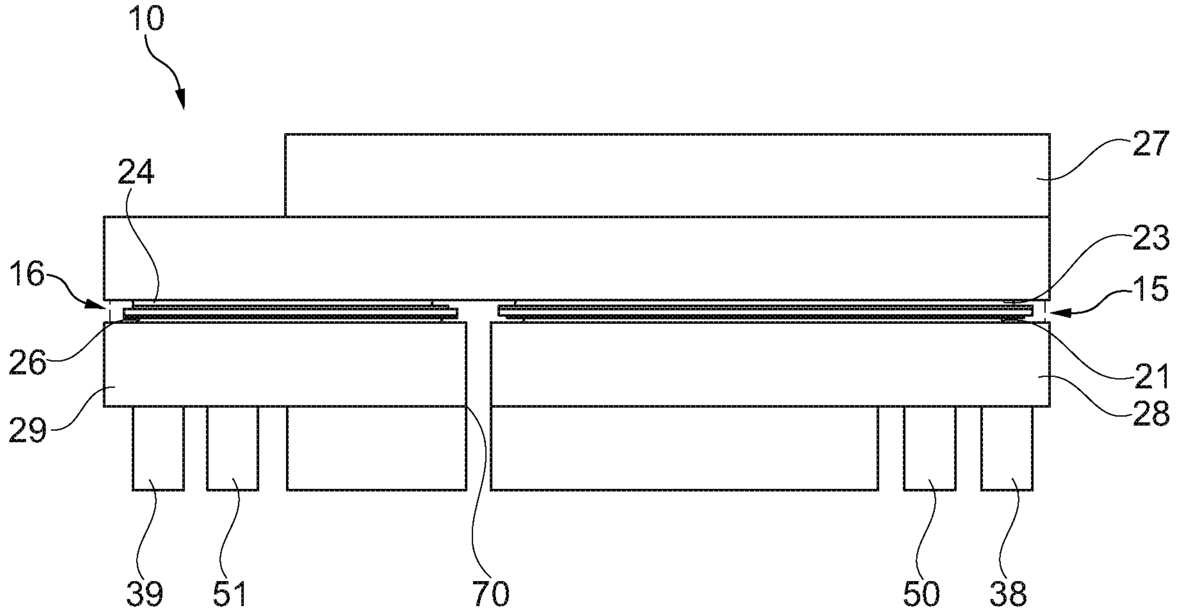
Figure 1G:
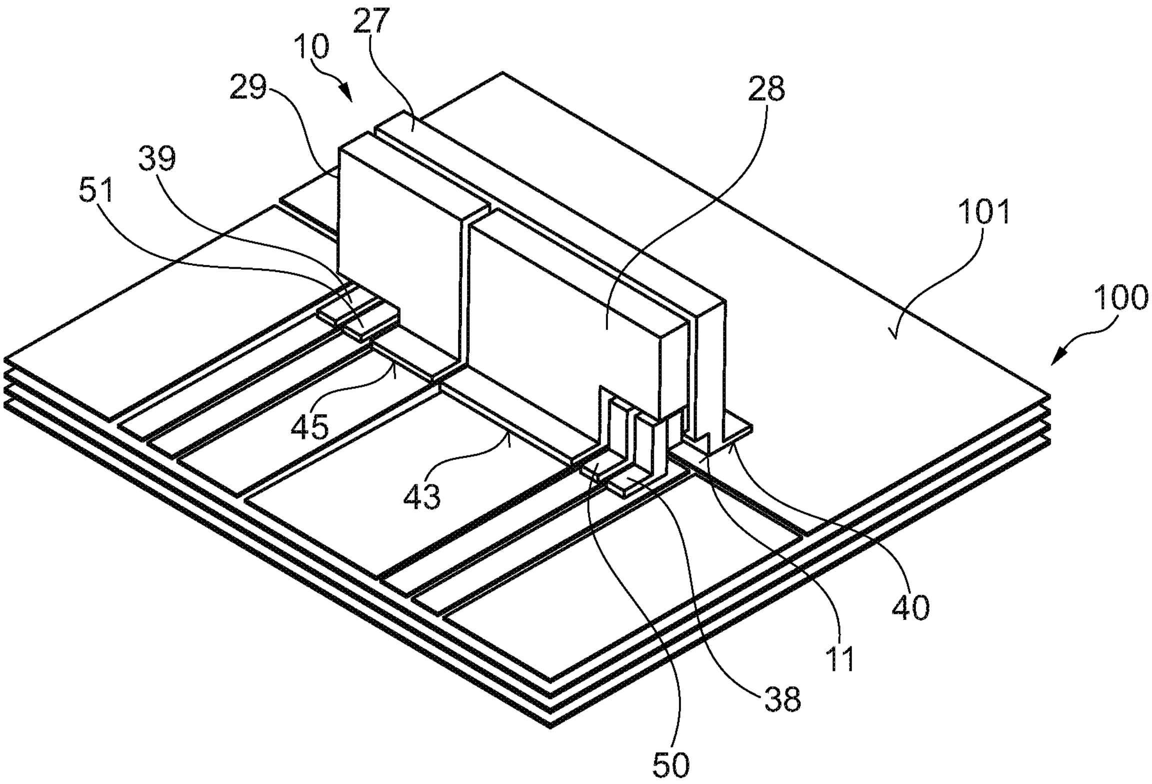

FIGS. 1A to 1G illustrates various views of a semiconductor package 10 which is suitable for upright or vertical mounting. FIG. 1A illustrates a perspective view of a side of the semiconductor package 10 and FIG. 1B a transparent perspective view of FIG. 1A. FIG. 1C illustrates a perspective view of an opposing side of the semiconductor package 10 and FIG. 1D illustrates a transparent perspective view corresponding to FIG. 1C. FIG. 1E illustrates a side view of the semiconductor package 10. FIG. 1F illustrates a top view of the semiconductor package 10 and FIG. 1G illustrates a perspective view of the semiconductor package 10 mounted in a vertical or upright position on a major surface 101 of a circuit board 100.

The semiconductor package 10 has a lower surface 11 in which the outer contacts of the package are arranged. The semiconductor package 10 has a substantially cuboid shape and has a height H, a width W and breadth B. The width W is smaller than the height H so that the lower surface 11 of the package 10 has an area of B×W. This area of the lower surface 11 is smaller than the area B×H. Thus, the lower surface 11 of the package 10 in this upright position has an area which is smaller than the area of the package 10 if it were to be mounted in horizontal arrangement with the area H×B arranged to form the lower surface. Consequently, when mounted in the upright or vertical position with the lower surface 11 of the package 10 mounted on the major surface 101 of a circuit board 100, as shown in FIG. 1G, the package occupies a reduced area on the circuit board 100.

The semiconductor package 10 comprises a low-voltage contact pad 12, a high-voltage contact pad 13 and an output contact pad 14 which are substantially coplanar to one another and which are arranged in the lower surface 11 of the package 10. The low-voltage contact pad 12, the high-voltage contact pad 13 and the output contact pad 14 provide the outer contacts of the package 10. In this embodiment, the lower surface 11 provides the mounting surface of the semiconductor package 10. The semiconductor package 10 is a surface mount device (SMD).

The semiconductor package 10 further comprises a first transistor device and a second transistor device 16 which are electrically coupled in series at an output node so as to form half bridge circuit. Referring to the transparent views of FIGS. 1B and 1D, the first transistor device 15 has a first major surface 17 and a second major surface 18 which opposes the first major surface 17. Similarly, the second transistor device 16 includes a first major surface 19 and a second major surface 20 which opposes the first major surface 19. The first transistor device 15 comprises a source electrode 21 and a gate electrode 22 arranged on the first major surface 17 and a drain electrode 23 which is arranged on the second major surface 18. The second transistor device 16 also includes a source electrode 24 and a gate electrode 25 on the first major surface 19 and a drain electrode 26 on the second major surface 20.

The first and second transistor devices 15, 16 are so-called "vertical" transistor devices since the drift path of the transistor device extends substantially perpendicularly to the first major surface 17, 19 of the respective transistor device. The first and second transistor devices 15, 16 may be MOSFET or IGBT devices, for example.

The first major surface 17 of the first transistor device 15 and the first major surface 19 of the second transistor device 16 are arranged substantially perpendicularly to the lower surface 11 of the semiconductor package 10 so that the first and second transistor devices 15, 16 have a vertical or upright arrangement with respect to the lower surface 11.

The semiconductor package 10 further comprises a first lead 27, a second lead 28 and a third lead 29. The second and third leads 28, 29 are arranged in a common plane laterally adjacent to one another and spaced apart from the first lead 27 by a device portion 30. The first transistor device 15 and the second transistor device 16 are arranged in the device portion 30. The first transistor device 15 and the second transistor device 16 are mounted on an inner surface 31 of the first lead 27 laterally adjacent to one another. The second lead 28 has an inner surface 32 which is mounted on the first transistor device 15 so that the first transistor device 15 is sandwiched between the first lead 27 and the second lead 28 as can be seen in the top view of FIG. 1F. The third lead 29 comprises an inner surface 33 which is mounted on the second transistor device 16 so that the second transistor device 16 is sandwiched between the first lead 27 and the third lead 29.

The first, second and thirds leads 27, 28, 29 are substantially planar and may be provided by metallic sheets or plates, for example a sheet or plate formed by Cu or a copper alloy.

The drain electrode 23 of the first transistor device 15 is mounted on and electrically connected to the inner surface 31 of the first lead 27 and the source electrode 24 on the first major surface 19 of the second transistor device 16 is mounted on and electrically connected to the inner surface 31 of the first lead 27 so that the first transistor device 15 and second transistor device are mounted on the inner surface 31 of the first lead 27 and laterally spaced apart from one another. The inner surface 31 of the second lead 28 is mounted on and electrically connected to the source electrode 21 on the first major surface 17 of the transistor device 15 and the inner surface 22 of the third lead 29 is mounted on and electrically connected to the drain electrode 26 on the second major surface 20 of the second transistor device 16. The second and third leads 28, 29 are laterally spaced apart from one another.

The first lead 27 therefore provides the output node (VSW) of the half bridge circuit since it is connected to the drain electrode 23 of the first transistor device 15, which provides the low side switch of the half bridge circuit, and to the source electrode 24 of the second transistor device 16 which provides the high side switch of the half bridge circuit. The second lead 28 provides the low-voltage contact pad 12 and GND of the half bridge circuit since it is electrically connected to the source electrode 21 of the first transistor device 15 and the third lead 29 provides the high-voltage contact pad 13 and VIN of the half bridge circuit since it is electrically connected to the drain 26 of the second transistor device 16.

The first transistor device 15 further comprises a first gate electrode 22 which is arranged on the first major surface 17 laterally adjacent to the source electrode 21 and the second transistor device 16 also comprises a second gate electrode 25 which is arranged on the first major surface 19 laterally adjacent to the source electrode 24. The first and second gate electrodes 22, 25 face in opposing directions within the semiconductor package 10.

The first gate electrode 22 is electrically connected to a first gate lead 38 and the second gate electrode 25 is electrically connected to a second gate lead 39. The first gate lead 38 is positioned in a common plane with the second lead 28 and third lead 29. The second gate lead 39 is partly positioned in a common plane with the second lead 28, the third lead 29.

The first lead 27 has a lower side face 40 which extends substantially perpendicularly to its inner surface 31 and which provides the output contact pad 14. In this embodiment, the first lead 27 has an L-shape in cross-section and has a first foot 41 which protrudes substantially perpendicularly from the outer surface 31' of the first lead 27 that opposes the inner surface 31 and away from the inner surface 31. The lower side face 40 of the first lead 27 is formed by the lower surface of the first foot 41 and has a larger area than the thickness of the vertical portion of the first lead 27 and of the upper side face 40' which opposes the lower side face 40. The lower side face 40 faces away from the first and second transistor devices 15, 16 and the opposing upper surface 40' faces in the opposing direction. The upper surface 40' extends into the outer surface 31' of the first lead 27.

Similarly, the second lead 28 also has an L-shape with a second foot 42, which extends substantially perpendicularly from its inner surface 32 and protrudes from the outer surface 32' away from its inner surface 32. The second foot 42 also has a lower surface 43 which faces away from the first and second transistor devices 16 provides the low-voltage contact pad 12. The lower surface 43 of the second foot 41 has a larger area than the thickness of the vertical portion of the second lead 28 and of the upper surface 43' which opposes the lower surface 43. The upper surface 43' extend into the outer surface 32' of the second lead 28.

Similarly, the third lead 29 has an L-shape having a third foot 44 which protrudes from the outer surface 33', which opposes the inner surface 33, and extends substantially perpendicularly to the inner surface 33 and away from the inner surface 33. The third foot 44 has a lower surface 45 which faces away from the first and second transistor devices 15, 16 and provides the high-voltage contact pad 13. The lower surface 45 of the third foot 44 has a larger area than the thickness of the vertical portion of the third lead 29 and of the upper surface 45' which opposes the lower surface 45. The upper surface 45' extends into the outer surface 33' of the third lead 29. The second foot 42 and third foot 44 extend in the opposing direction from the first foot 41 of the first lead 27 and substantially parallel to one another.

The inner surface 31 of the first lead 27 may have a cutout section 36 formed along the edge between the inner surface 31 and the lower surface 40 such that the lower side face 40 is spaced apart from the further away from the first and second transistor devices 15, 16 than the inner surface 31. The second lead 28 and the third lead 33 may have the same form with a cut out section 36 formed in the edge between the lower surface 43 and inner surface 32 of the second lead 28 and between the lower surface 45 and the inner surface 33 of the third lead 29. The side face of each of the first and second transistor devices 15, 16 is spaced apart from the mounting surface 11 by at least the height of the cutout section 36.

The distance between the output contact pad 14 and the low voltage contact pad 12 and the distance between the output contact pad 14 and the high voltage contact pad 13 is greater than the distance between the inner surface 31 of the first lead and the inner surface 32, 33 of the second and third leads 28, 29 that are attached to the first and second transistors devices 15, 16. This arrangement may be used to assist in reducing capacitive coupling.

The second lead 28 has a cutout section 37, which, in this embodiment, is positioned the lower outer corner of the second lead 28. The first gate electrode 22 is positioned in the cutout section 37 and is, therefore, uncovered by the second lead 28. The first gate lead 38 also has an L-shape in cross-section and is positioned in this cutout section 37 of the second lead 28. The first gate lead 38 has an inner surface 55 that is attached and electrically connected to the first gate electrode 22. The first gate lead 38 comprises a foot 56 which protrudes from the outer surface 55', which opposes the inner surface 55, and extends substantially perpendicularly to its inner surface 55 and away from its inner surface 55. The foot 56 has a lower side face 57 which provides the first gate contact pad 58. The lower side face 57 extends substantially perpendicularly to the inner surface 55 and is substantially coplanar with the lower surface 43 of the foot 42 of the second lead 28. The first gate lead 38 also has a cutout section 37 formed in the edge between the lower surface 57 and the inner surface 55 so that the lower surface 57 is spaced apart from the first major surface 19 of the first transistor device 15.

Referring to the perspective views of FIGS. 1C and 1D, the first lead 27 has a cutout section 37 formed in a lower outer corner at a position on the opposing side of the device portion 30 from a cutout section 37 of the third lead 29. The second gate electrode 25 is positioned in the cutout section 37 so that the second gate electrode 25 is uncovered by the first lead 27. The second gate lead 39 has a different form to the first gate lead 38 and includes a connection portion 46 which is positioned on the second gate electrode 25 in the cutout section 37 formed in the first lead 27. The second gate lead 39 extends from this connection portion 46 under and spaced apart from, the side face of the second transistor device 16, as can be seen from the transparent perspective view of FIG. 1B. The second gate lead 39 has a distal end 47 which has a lower surface 48 that is positioned in a common plane with the lower surface 45 of the third foot 44 of the third lead 29. The lower surface 48 provides the second gate contact pad 59 of the semiconductor package 10. Thus, the second gate lead 39 provides a conductive redistribution structure from one side of the device portion 30 of the package 10 to the opposing side of the device portion 30 of the package 10. The lower surface 57, 48 of each of the two gate leads 38, 39, which provides the respective gate contact pad 58, 59 of the package 10, are positioned on the same side of the device portion 30 even though the first and second gate electrodes 22, 25 of the first and second transistor devices 15, 16, respectively, face in opposing directions.

In some embodiments, one or both of the first and second transistor devices 15, 16 further comprise one or more auxiliary functions, such as source sensing. In these embodiments, as can be seen in FIGS. 1A to 1G, the semiconductor package 10 further comprises a first auxiliary lead 50 which is connected to an auxiliary terminal 52 on the first major surface 17 of the first transistor device 16 and a second auxiliary lead 51 which is electrically connected to a second auxiliary terminal 53 arranged on the first major surface 19 of the second transistor device 16. The first auxiliary lead 50 may have the same shape as the first gate lead 38 and the second auxiliary lead 51 may have the same shape as the second gate lead 39.

In some non-illustrated embodiments, each of the leads is planar and does not have a foot. The contact pad is provided by the side face of the lead and has a width that is the same as the thickness of the portion of the lead which is attached to the transistor device.

Figure 2B:
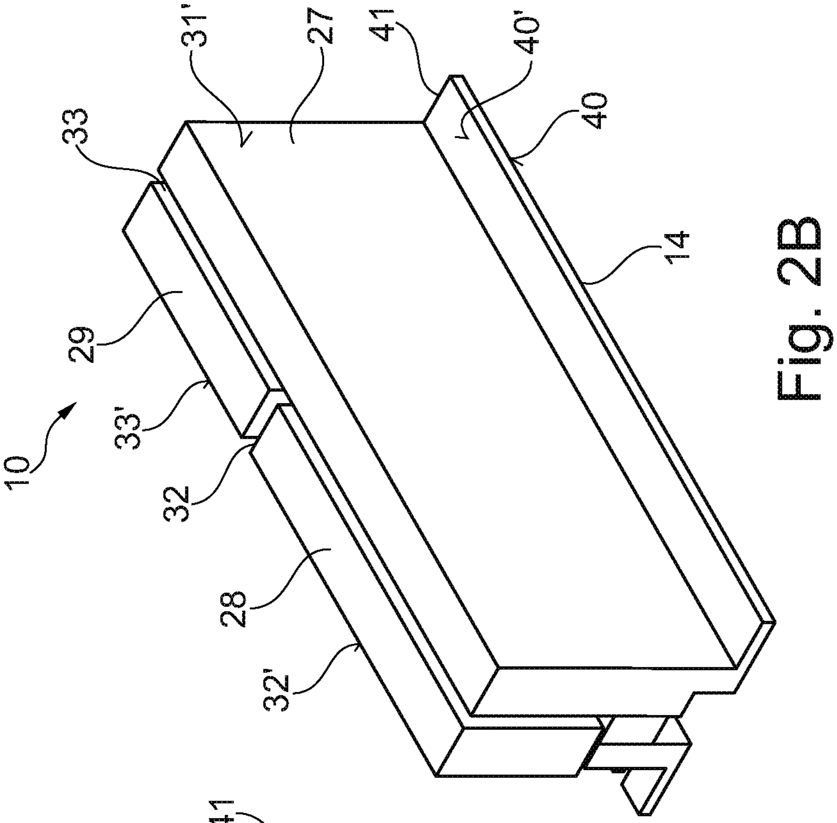
FIGS. 2A to 2D illustrate various views of a semiconductor package according to another embodiment which is suitable for upright or vertical mounting.
Figure 2A:
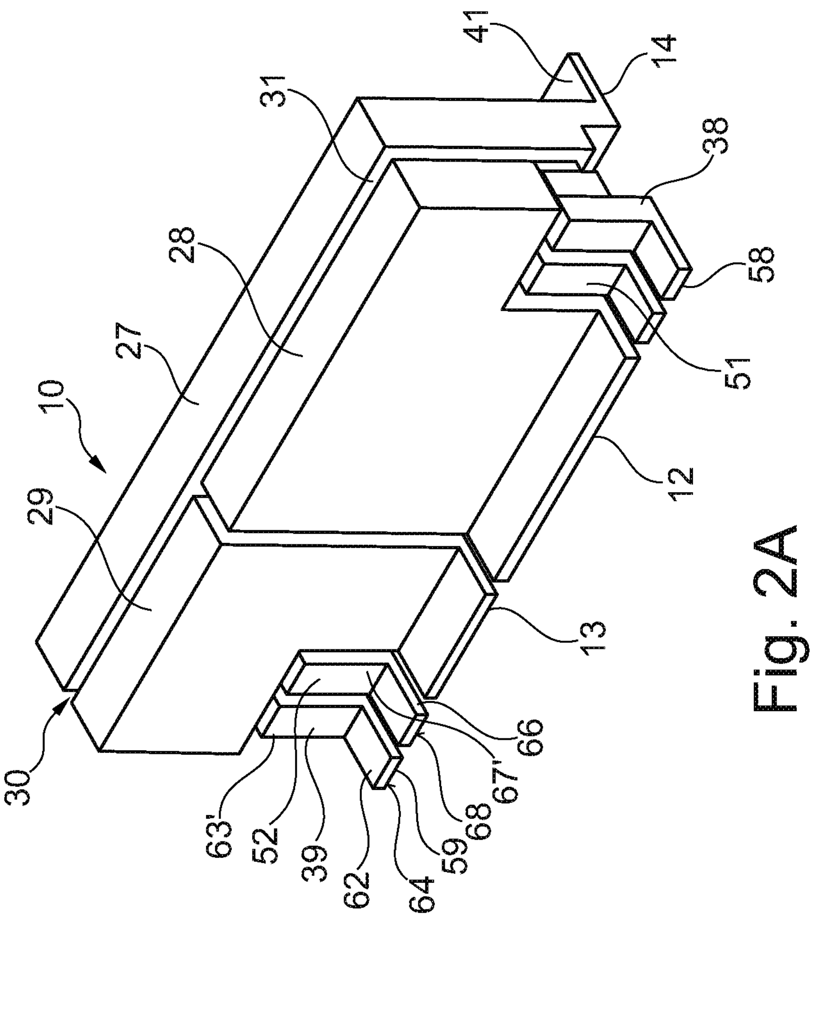
Figure 2C:
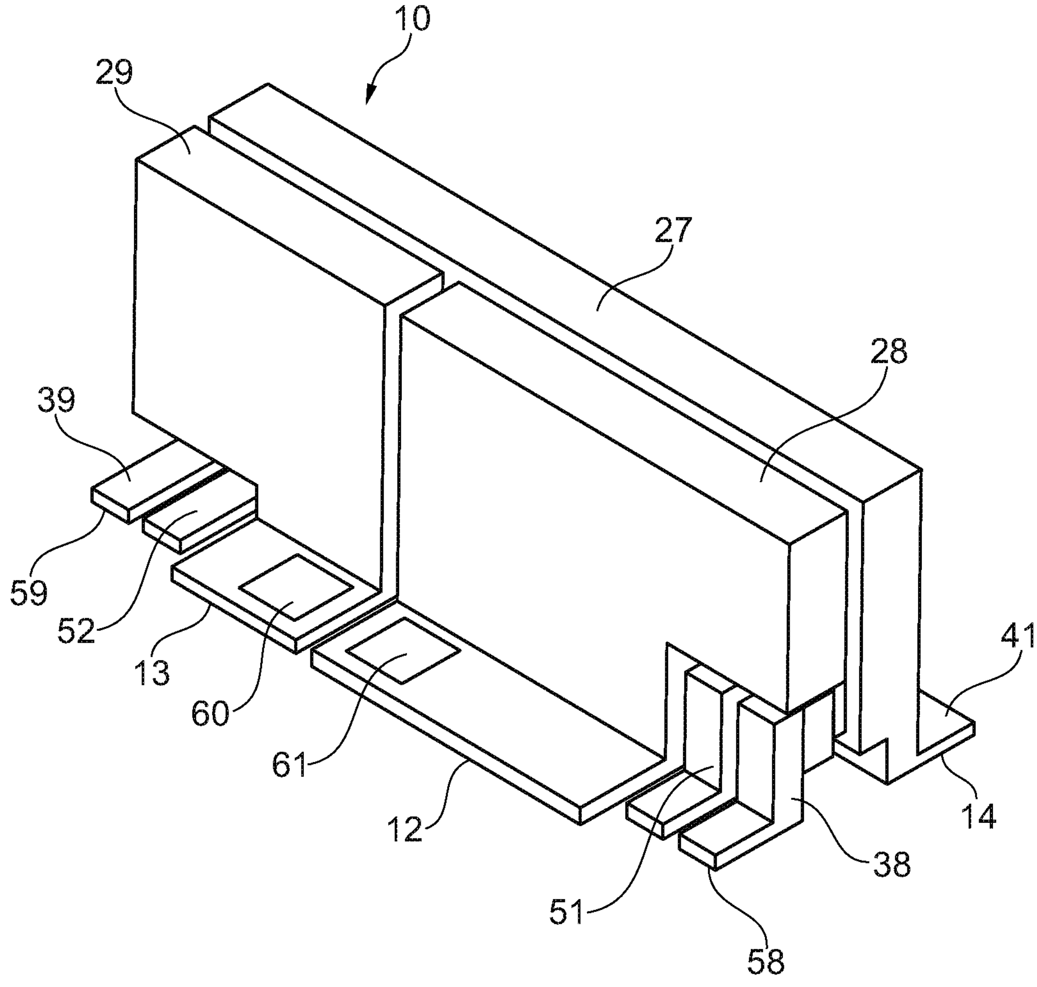
Figure 2D:
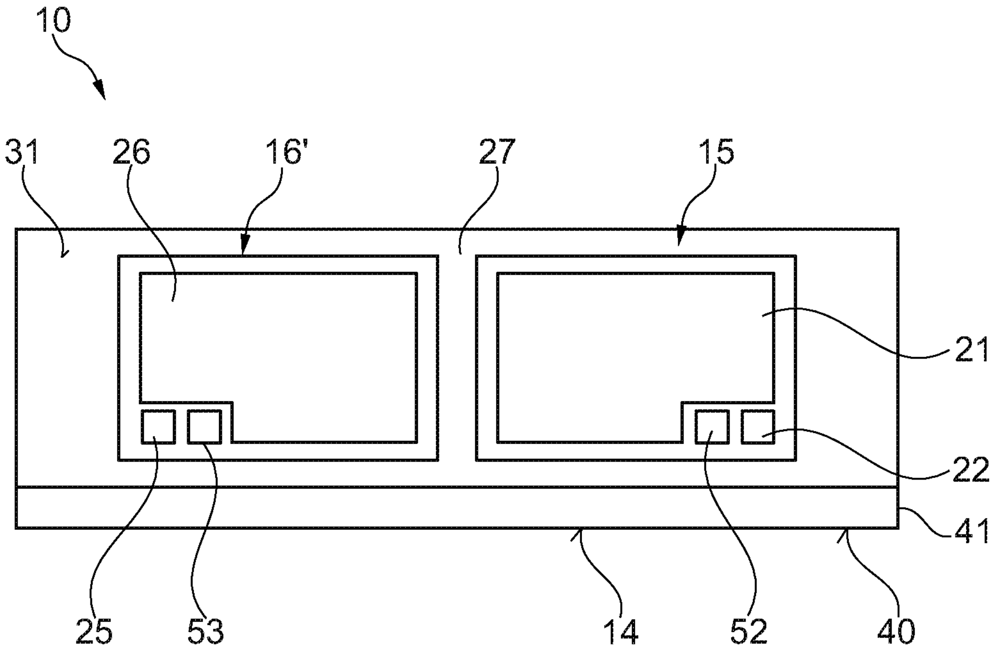

FIGS. 2A to 2D illustrate various views of a semiconductor package 10' according to another embodiment. FIGS. 2A, 2B and 2C illustrate perspective views of the semiconductor package 10' and FIG. 2D illustrates a cross-sectional view of the semiconductor package 10'.

The semiconductor package 10' comprises first and second transistor devices 15, 16' which are arranged in a device portion 30 between a first lead 27 arranged on a first side of the device portion 30 and a second lead 28 and a third lead 29 arranged adjacent one another on the second opposing side of the device portion 30 as in the embodiment illustrated and described with reference to FIGS. 1A to 1G. The drain electrode 23 of the first transistor device 15 and the source electrode 24 of the second transistor device 16' are mounted on the inner surface 31 of the first lead 27, the inner surface 32 of the second lead 28 is mounted on the source electrode 21 of the first transistor device 15 and the inner surface 33 of the third lead 29 is mounted on the drain electrode 26 of the second transistor device 16'.

In the semiconductor package 10', the second transistor device 16' differs from that of the semiconductor package 10 in that the second gate electrode 25 is arranged on the second major surface 20 laterally adjacent to the drain electrode 26, as can be seen in the view of FIG. 2D. In this embodiment, the first gate electrode 22 of the first transistor device 15 and the second gate electrode 25 of the second transistor device 16' of the half-bridge circuit face in the same direction.

The second transistor device 16' comprises a plurality of transistor cells coupled in series, each transistor cell having a source region, a body region and a gate formed in the first major surface 19 as in the semiconductor device 16. These gates of the transistor cells are electrically coupled to the second gate electrode 25 that is arranged on the opposing second major surface 20 by one or more conductive vias which extend through the thickness of the second transistor device 16'.

The auxiliary pad 51 of the second transistor device 16' is also arranged on the second major surface 20 of the second transistor device 16' laterally adjacent to the drain electrode 26 and between the drain electrode 26 and the second gate electrode 25. If the auxiliary circuit is formed at the opposing first major surface 19 of the transistor device 16' the auxiliary circuit is electrically connected to the auxiliary pad 51 by one or more conductive vias which extends through the thickness of the second transistor device 16 is formed. The first and second auxiliary pads 50, 51, therefore, also face in the same direction. The auxiliary circuit may provide source sensing, for example.

Referring to the perspective view of FIG. 2A, in this embodiment, the second gate lead 39 and the second auxiliary lead 51 each have an L-shaped form in cross-section and have the same form as the first gate lead 38 and the first auxiliary lead 50. The second gate lead 39 has a foot 62 protruding from an outer surface 63' of an upright section with the inner surface 63 of the upright section being mounted on and electrically connected to the second gate electrode 25. The lower surface 64 of the foot 62 provides the second gate contact pad 59 of the package 10'. The second auxiliary lead 51 also has a foot 66 protruding from an outer surface 67' of an upright section with the inner surface 67 of the upright section being mounted on and electrically connected to the second auxiliary terminal 52. The lower surface 68 of the foot 67 provides the second auxiliary contact pad of the package 10'.

The second gate lead 38 and the second auxiliary lead 51 are arranged only on the second side of the device portion 30 and in a row with the second and third leads 28, 29 and the first gate lead 38 and first auxiliary lead 50 and at the opposing end of the package 10 from the first gate lead 38 and first auxiliary lead 50. In this embodiment, the third lead 29 has a cutout section 37 formed in its outer lower corner in which the second gate electrode 25 and the second auxiliary terminal 51 on the second major surface 20 of the second transistor device 16' are arranged. The second gate electrode 25 and the second auxiliary terminal 51 remain uncovered by the third lead 29. The second gate lead 39 and also the second auxiliary lead 51 are positioned only within the cutout of the third lead 29 and do not extend under the side face of the second transistor device 16. As can be seen in the perspective view of the first lead 22 shown in FIG. 2B, the upright portion of the first lead 27 has a substantially rectangular form and does not have a cutout. The output contact pad 14 extends along the substantially the entire breadth of the package 10'.

FIG. 2C illustrates an embodiment of the semiconductor package 10' which can further comprise a capacitor and/or capacitor pads 60, 61 on which a capacitor can be mounted. A capacitor can be mounted on the upper side 43' of the foot 42 of the second lead 28 and the upper side 45' of the foot 44 of the third lead 29. The upper surface 43' of the foot 42 of the second lead 28 faces in the opposing direction to the lower surface 43 which provides the low-voltage contact pad 12. Similarly, the upper side 45' of the foot 44 of the third lead 29 faces on the opposing direction to the lower side 45 which provides the high-voltage contact pad 13.

FIG. 2C illustrates a first capacitor contact pad 60 arranged on the upper surface 43' of the foot 42 of the second lead 28 and a second capacitor contact pad 61 arranged on the upper surface 45' of the foot 44 of the third lead 29 onto which a capacitor may be mounted. The capacitor may be mounted on and electrically connected to the first and second contact pads 60, 61 and, therefore, extend and be electrically connected between the low and high voltage contact pads 12, 13 of the semiconductor package 10. The capacitor contact pads 60, 61 may be discernible by use of a layer of an additional material, for example a solderable material. In other embodiments, a separate contact pad is not used.

A capacitor and/or capacitor pads may also be included in the upper surface 43', 45' of the foot 42, 44 of the second and third leads 28, 29 of the semiconductor package 10 described with reference to FIGS. 1A to 1G.

Figure 3A:
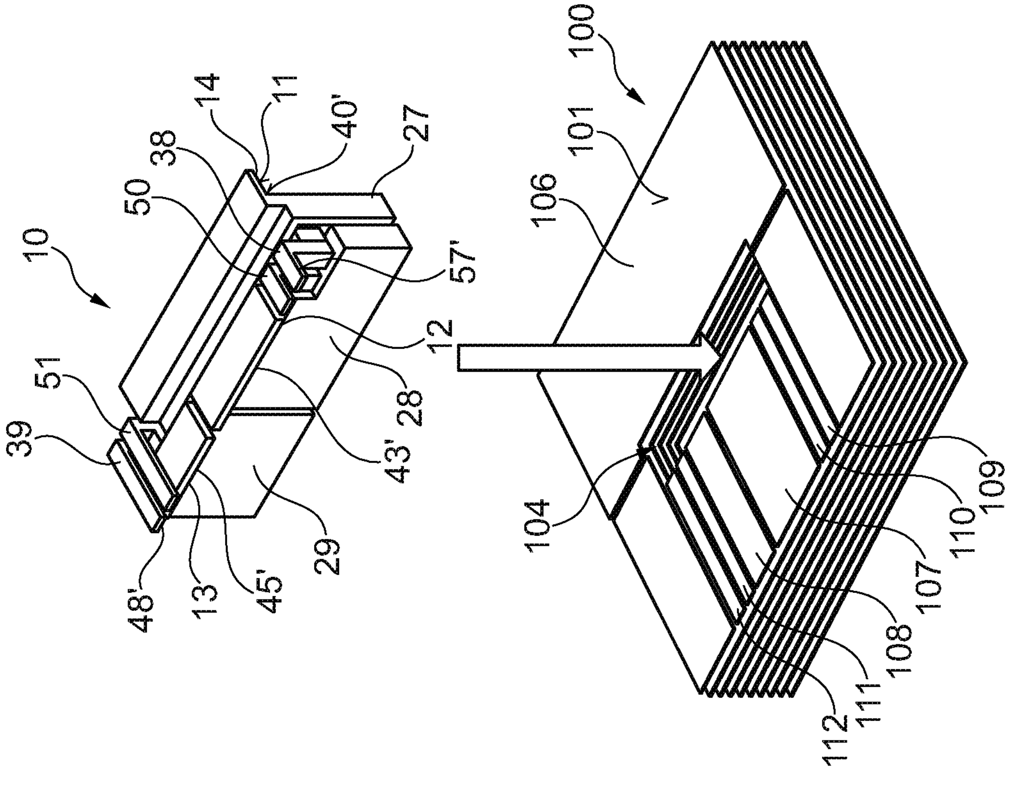
FIGS. 3A to 3D illustrate an embodiment in which the semiconductor package of FIGS. 1A to 1G is embedded in a circuit board.
Figure 3B:
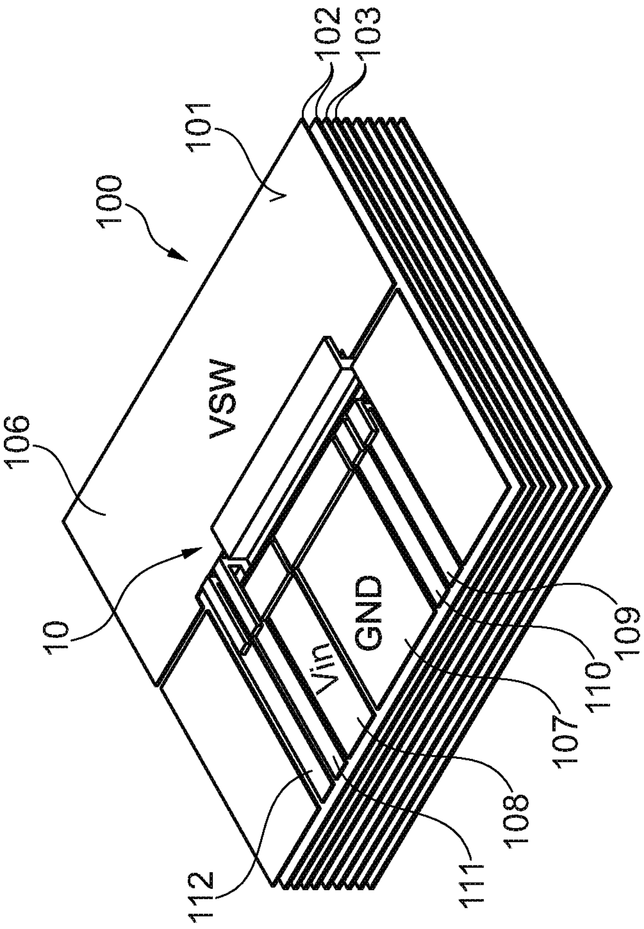
Figure 3D:
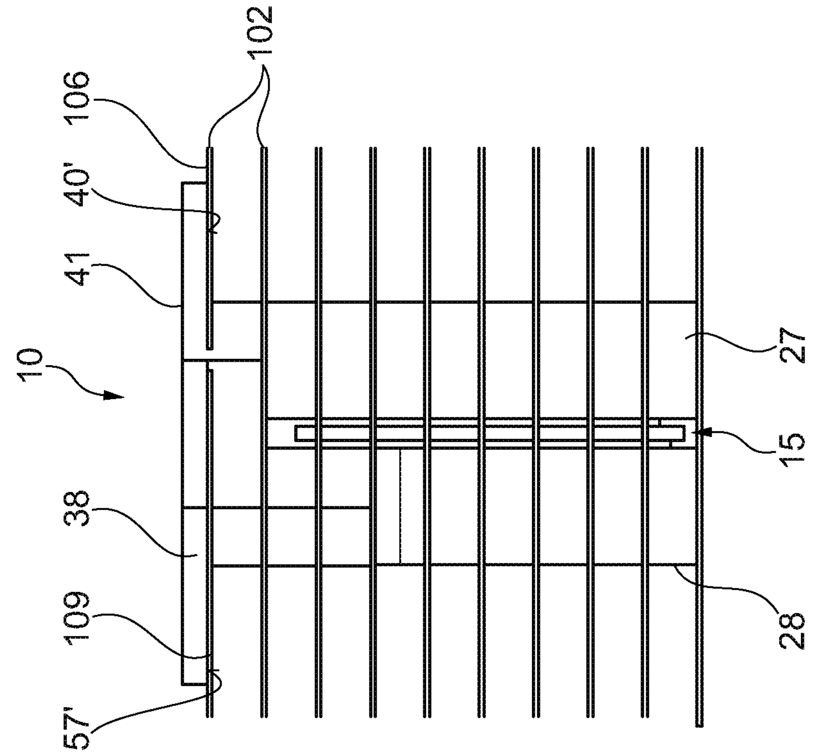
Figure 3C:
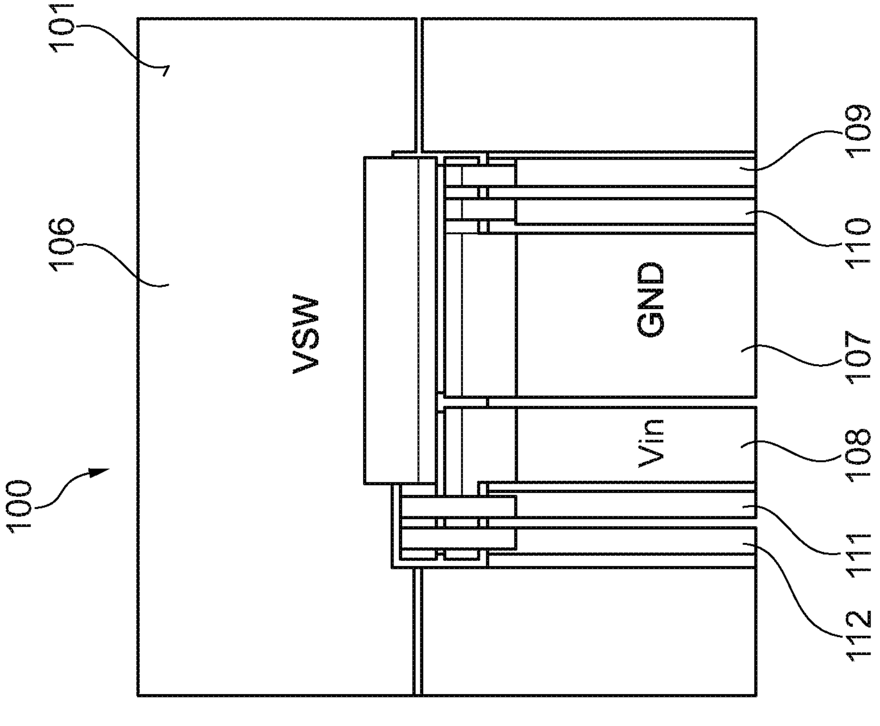

FIGS. 3A to 3D illustrate an embodiment in which the semiconductor package 10 as described with reference to FIGS. 1A to 1G is mounted in an upright position by embedding the semiconductor package 10 in the circuit board 100. FIG. 3A illustrates a perspective view of the orientation of the semiconductor package 10 with respect to the circuit board 100. FIG. 3B illustrates a perspective view and FIG. 3C a top view of the semiconductor package 10 embedded within a recess 104 from in the circuit board 100. FIG. 3D illustrates a side view of the semiconductor package 10 mounted within the recess 104.

Referring to FIG. 3A, the circuit board 100 includes a recess 104 which extends from the first major surface 101 into the circuit board 100 which is sized and shaped to accommodate the semiconductor package 10. The semiconductor package 10 is positioned within the recess 104 in an inverted orientation with the surface 11, which formed the lower surface and mounting surface of the semiconductor package 10 in the embodiment illustrated in FIG. 1G, facing upwards away from the first major surface 101. In this orientation, the foot of each of the first lead 27, second lead 28, third lead 29 as well as of the first gate lead 38 second gate lead 39 is arranged at the top of package 10. The upper surface of the foot of each of the respective leads faces towards and is arranged on the first major surface 101 of the circuit board 100 and thus forms the contact pad and the mounting surface of the package 10.

Consequently, in this embodiment, the low-voltage contact pad 12 is formed by the opposing surface 43' of the foot 42 of the second lead 28 compared to the surface 43 of the foot 41 which forms the low-voltage contact pad 12 in the orientation illustrated in FIG. 1G. Similarly, the high-voltage contact pad 13 is formed by the opposing surface 45' of the foot 44 of the third lead 29 compared to the surface 45 of the foot 44 which forms the high-voltage contact pad 13 in the orientation illustrated in FIG. 1G and the output contact pad 14 is formed by the opposing surface 40' of the foot 41 of the first lead 27 compared to the surface 40 of the foot 41 which forms the output contact pad 14 in the orientation illustrated in FIG. 1G.

The first gate contact pad 58 is formed by the opposing surface 57' of the foot 56 of the first gate lead 38 compared to the surface of the foot 57 which forms the first gate contact pad 58 in the orientation illustrated in FIG. 1G and the second gate contact pad 59 is formed by the opposing surface 48' of the distal end 47 of the second gate lead 39 compared to the surface of the distal end 47 which forms the second gate contact pad 59 in the orientation illustrated in FIG. 1G.

The circuit board 100 has a plurality of layers 102 each of which comprises an electrically insulating core with conductive traces on one or both of its opposing surfaces and conductive vias which extend through the core in order to provide a three-dimensional conductive redistribution structure 103. The first major surface 101 comprises a plurality of conductive traces which are arranged around the recess 104 so as to contact the pads of the semiconductor package 10 formed by the upper surface of the foot of the leads when it is positioned within the recess 104.

An output contact trace 106 is arranged abutting one side of the recess 104 so that the upper surface 40' of the foot 41 of the first lead 27 that provides the output contact pad 14 of the package 10 can be mounted on and electrically connected to the trace 106. On the opposing side of the recess 104, a low-voltage contact trace 107 and a high-voltage contact trace 108 are provided onto which the upper surface 43', 49' of the foot of the second and third leads 28, 29 that provides the low-voltage contact pad 12 and high-voltage contact pad 13 of the package 10, respectively, will be mounted. Similarly, on this side of the recess 104, a first gate trace 109 and a first auxiliary trace 110, which are arranged adjacent the low-voltage contact trace 107, are provided onto which the upper surface 59' of the first gate lead 38 and first auxiliary lead 50, respectively, are mounted. Similarly, a second gate trace 111 and a second auxiliary trace 112 are arranged adjacent to the high-voltage contact trace 108 onto which the upper surface 58' of the second gate pad 39 and of second auxiliary pad 51 are mounted.

The semiconductor package 10, 10' may also comprise a mold compound 70 (which is shown schematically in FIGS. 1E and 1F) which is positioned in the device portion 30 so as to cover at least the first transistor device 15, and second transistor devices 16; 16' and the inner surface 31, 32, 33 of the first, second and third leads 27, 28, 29 that bound the device portion 30. The lower surface 40, 43, 45 of the first, second and third leads 27, 28, 29 are uncovered by the mold compound 70 so as to provide the outer contact pads 12, 13, 14 of the package 10, 10'. In some embodiments, the opposing upper surface 40, 43, 45 of the foot 41, 42, 44 of each of the of the first, second and third leads 27, 28, 29 and the opposing upper surface 64' 57' of the first and second gate leads 38,39 and of first and second auxiliary leads 50, 51, if present, are uncovered by the mold compound 70 so as to provide the outer contact pads of the package 10, 10'. The outer surfaces 31', 32', 33' of the of the first, second and third leads 27, 28, 29 may also remain uncovered by the mold compound 70 and provide vertical cooling surfaces from which heat generated by the first and second transistor devices 15, 16; 16' can be dissipated.

Figure 4B:
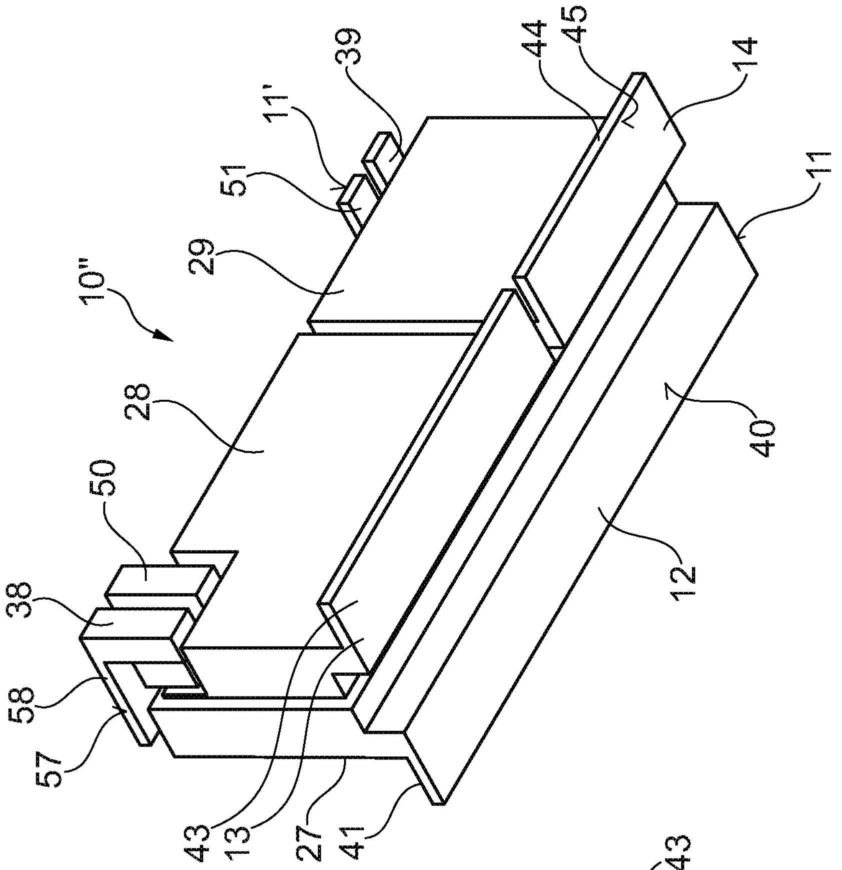
FIGS. 4A and 4B illustrate perspective views of a semiconductor package according to an embodiment.
Figure 4A:
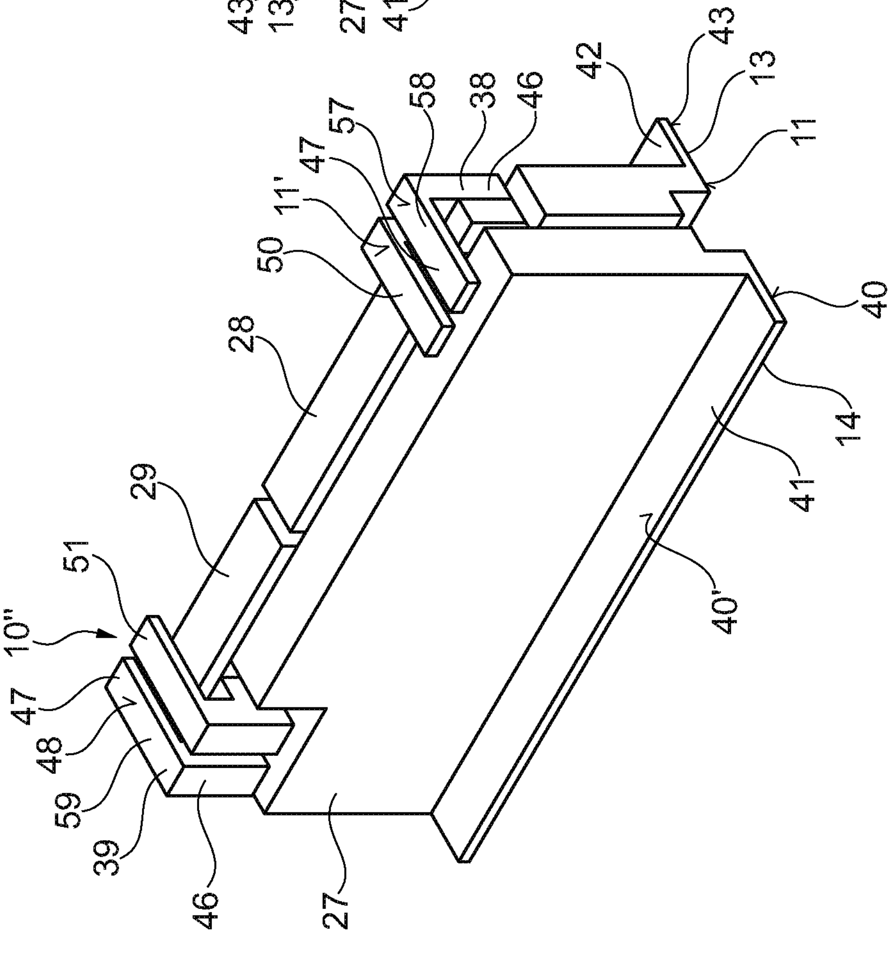

FIGS. 4A and 4B each illustrate a perspective view of a semiconductor package 10" which differs from that illustrated in FIGS. 1A to 3D in that it includes two mounting surfaces 11, 11' at opposing side faces, each mounting surface 11, 11' extending substantially perpendicularly for the first major surface 19, 21 of the first and second transistor devices 15, 16, respectively, and substantially parallel to one another. As in the embodiment illustrated in FIGS. 1A to 3D, the low voltage contact pad 12, the high voltage contact pad 13 and the output contact pad 14 are provided by the second lead 28, third lead 29 and first lead 27, respectively. The first, second and third leads 27, 28, 29 each include a L-shape in cross-section with a foot 41, 42, 44 whose lower surface 40, 43, 45 that faces away from the first and second transistor device 15, 16 forms the contact pad 12, 13, 14 of the package 10".

The first and second gate leads 38, 39 and, in this embodiment, the first and second auxiliary leads 50, 51 are arranged at the opposing side face 11' and substantially parallel to and coplanar one another to form the second mounting surface 11'. The second mounting surface 11' is formed by the surface 48', 57' of the first and second gate leads 38, 39 which faces towards the first and second transistor devices 15, 16. In this embodiment, the first gate leads 38 has the same form as the second gate lead 39 such that each has distal portion 47 that extends over a side face of the first and second transistor device 15, 16, respectively and is positioned above the first lead 27 and third lead 39, respectively. The first and second auxiliary leads 50, 51 have the same form as the first and second gate leads 38, 39, respectively.

Figure 5:
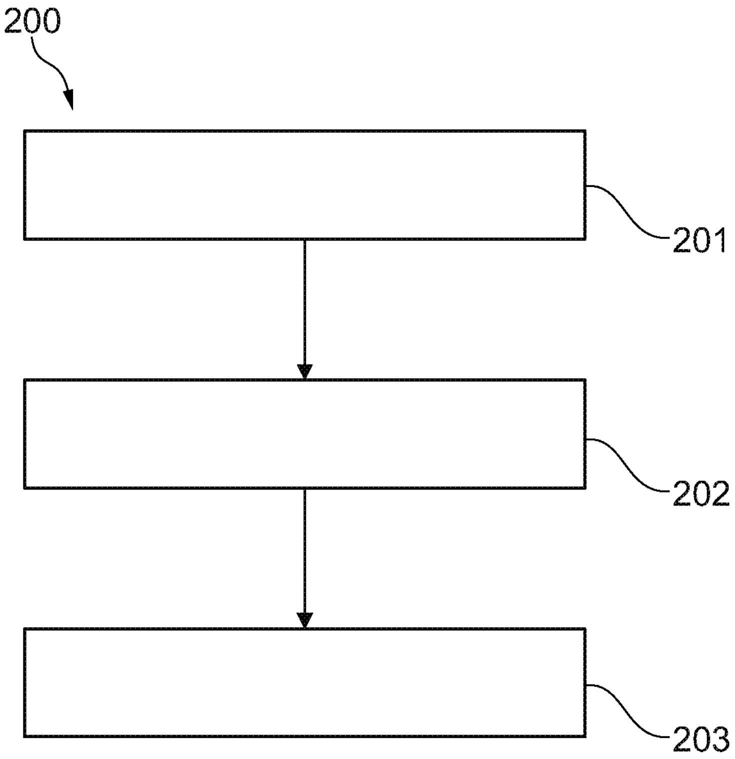
FIG. 5 illustrates a flowchart of a method for fabricating a semiconductor package.

FIG. 5 illustrates a flowchart 200 of a method for fabricating a semiconductor package, which can be used to fabricate the semiconductor package of any one of the embodiments described herein.

In box 201, a second power electrode on a second major surface of a first transistor device is attached to an inner surface of a first lead and a first power electrode on a first major surface of a second transistor device is attached to the inner surface of a first lead. The first lead has a lower side face that extends substantially perpendicularly to its inner surface and the lower side face of the first leads provide an output contact pad of the semiconductor package.

In box 202, an inner surface of a second lead is attached to a first power electrode on a first major surface of the first transistor device, the first major surface opposing the second major surface of the first transistor device. The second lead has a lower side face that extends substantially perpendicularly to its inner surface and the lower side face of the second lead provides a low voltage contact of the semiconductor package.

In box 203, an inner surface of a third lead is attached to a second power electrode on a second major surface of the second transistor device, the second major surface opposing the first major surface of the second transistor device. The third lead has a lower side face that extends substantially perpendicularly to its inner surface and the lower side face of the third lead provides a high voltage contact pad of the semiconductor package. The output contact pad, the low voltage contact pad and the high voltage contact pad of the semiconductor package are substantially coplanar.

Figure 6:
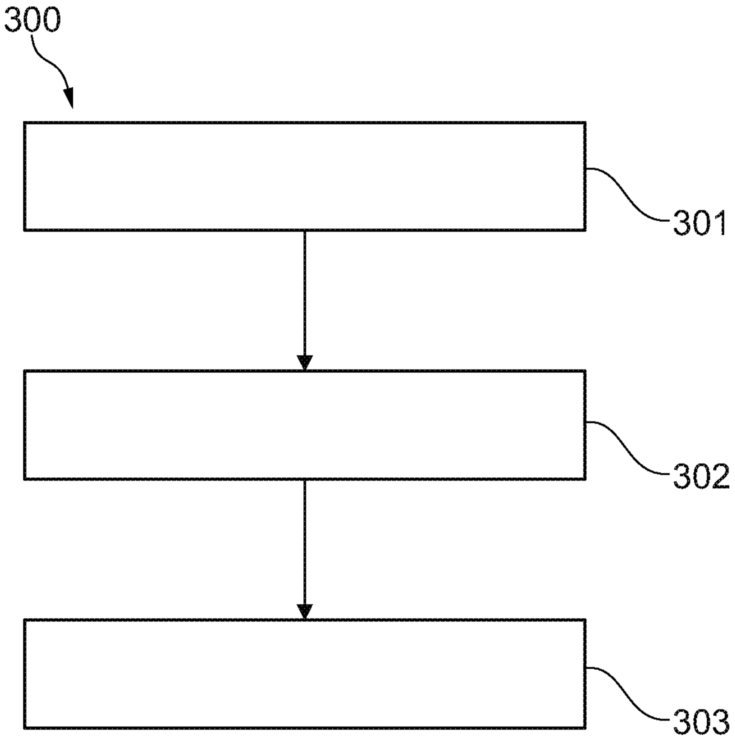
FIG. 6 illustrates a flowchart of a method for embedding a semiconductor package in a circuit board.

FIG. 6 illustrates a flowchart 300 of a method for mounting the semiconductor package of any one of the embodiments described herein on a circuit board, in particular for embedding the semiconductor package of any one of the embodiments described herein in a circuit board.

In box 301, a circuit board having a first major surface, a recess in the first major surface and a plurality of conductive traces on the first major surface is provided. The recess is sized and shaped to receive the semiconductor package in an upright orientation such that the inner surface of the first lead is substantially perpendicular to the first major surface of the circuit board.

In box 302, the semiconductor package is inserted into the recess such that the inner surface of the first lead is substantially perpendicular to the first major surface of the circuit board.

In box 303, an upper surface of the foot of each of the first, second and third leads electrically connecting to one of the conductive traces, the upper surface opposing the lower side face.

In some embodiments, the method further comprises in box 303 electrically connecting an upper surface of the foot of the first gate lead and/or of the second gate lead to conductive traces on the first major surface of the circuit board.

In some embodiments, the conductive traces for the first and second gate lead are arranged in a different layer of the circuit board, i.e. different form the first major surface. In these embodiments, the method comprises electrically connecting an upper surface of the foot of the first gate lead and/or of the second gate lead to conductive traces on a further surface of the circuit board.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
- a low voltage contact pad;
- a high voltage contact pad;
- an output contact pad;
- a half-bridge circuit comprising a first transistor device and a second transistor device coupled in series at an output node, wherein the first transistor device has a first major surface, wherein the second transistor device has a first major surface, and wherein both the first transistor device and of the second transistor device are oriented substantially perpendicular with respect to each of the low voltage contact pad, the high voltage contact pad and the output contact pad;
- a first lead;
- a second lead; and
- a third lead;
- wherein the first and second transistor devices are arranged in a device portion of the semiconductor package and are mounted on the first lead,
- wherein a bent part of the first lead forms the output contact pad and is arranged on a first side of the device portion,
- wherein the second and third leads are arranged in a common plane on a second side of the device portion that opposes the first side,
- wherein a bent part of the second lead forms the low voltage contact pad, and
- wherein a bent part of the third lead forms the high voltage contact pad.

2. The semiconductor package of claim 1, wherein:
- the first transistor device comprises a first power electrode on the first major surface of the first transistor device and a second power electrode on a second major surface of the first transistor device opposing the first major surface of the first transistor device;
- the second transistor device comprises a first power electrode on the first major surface of the second transistor device and a second power electrode on a second major surface of the second transistor device opposing the first major surface of the second transistor device;
- the first lead comprises an inner surface, onto which the second power electrode of the first transistor device and the first power electrode of the second transistor device are attached;
- the second lead comprises an inner surface that is attached to the first power electrode of the first transistor device; and
- the third lead comprises an inner surface that is attached to the second power electrode of the second transistor device.

3. The semiconductor package of claim 2, wherein:
- the first lead has a lower side face that extends substantially perpendicularly to the inner surface of the first lead and that forms a surface of the output contact pad;
- the second lead has a lower side face that forms a surface of the low voltage contact pad and that extends substantially perpendicularly to the inner surface of the second lead and substantially parallel to the lower side face of the first lead; and
- the third lead has a lower side face that forms a surface of the high voltage contact pad and that extends substantially perpendicularly to the inner surface of the third lead and substantially parallel to the lower side face of the first lead.

4. The semiconductor package of claim 1, wherein:
- the first transistor device further comprises a first control electrode that is arranged on the first major surface of the first transistor device and connected to a first gate lead;
- the second transistor device further comprises a second control electrode that is arranged on the first major surface of the second transistor device and connected to a second gate lead; and
- the first and second gate leads are arranged in a common plane with the second lead and the third lead.

5. The semiconductor package of claim 4, wherein the first gate lead is positioned in a cut-out of the second lead, and wherein the second gate lead extends from a plane that is common with the first lead, under the second transistor device, and has a lower side face that forms a surface of a second gate pad and that extends substantially parallel to a lower side face of the third lead.

6. The semiconductor package of claim 1, wherein the first transistor device comprises a first control electrode arranged on the first major surface of the first transistor device, and wherein the second transistor device comprises a second control electrode arranged on the first major surface of the second transistor device.

7. The semiconductor package of claim 6, further comprising a first gate lead arranged in a cut-out of the second lead and a second gate lead is arranged in a cut-out of the third lead.

8. The semiconductor package of claim 4, wherein the first gate lead has a lower side face that extends substantially parallel to a lower side face of the second lead and forms a surface of a first gate contact pad, and wherein the second gate lead has a lower side face that extends substantially parallel to a lower side face of the third lead and forms a surface of a second gate contact pad.

9. The semiconductor package of claim 1, wherein the first transistor device and/or the second transistor device further comprises an auxiliary terminal, the semiconductor package further comprising an auxiliary lead that is mounted on the auxiliary terminal and that has a lower side face that extends substantially parallel to a lower side face of the second lead and that forms a surface of an auxiliary contact pad.

10. The semiconductor package of claim 1, further comprising a mold compound enclosing at least part of the first and second transistor devices and at least part of the first, second, and third leads.

11. The semiconductor package of claim 10, wherein a lower side face of the first lead, a lower side face of the second lead, and a lower side face of the third lead are arranged within an area of the semiconductor package defined by the mold compound.

12. The semiconductor package of claim 1, wherein the first lead has an L-shape having a foot that extends in a first direction and perpendicularly to the first major surface of the first transistor device, wherein a lower surface of the foot provides a lower side face of the first lead, wherein the second lead has a L-shape having a foot that extends in a second direction opposing the first direction, and wherein the third lead has a L-shape having a foot that extends parallel to the second direction.

* * * * *